United States Patent
Kim et al.

(10) Patent No.: US 8,735,883 B2
(45) Date of Patent: May 27, 2014

(54) OXIDE THIN FILM TRANSISTOR AND METHOD OF FABRICATING THE SAME

(75) Inventors: Dae-Hwan Kim, Gyeonggi-Do (KR); Byung-Kook Choi, Gyeonggi-Do (KR); Sul Lee, Gyeonggi-Do (KR); Hoon Yim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/324,751

(22) Filed: Dec. 13, 2011

(65) Prior Publication Data

US 2012/0146017 A1    Jun. 14, 2012

(30) Foreign Application Priority Data

Dec. 13, 2010  (KR) .................. 10-2010-0127171

(51) Int. Cl.
*H01L 29/10*  (2006.01)
*H01L 29/786*  (2006.01)
*H01L 27/12*  (2006.01)

(52) U.S. Cl.
CPC ............... *H01L 29/7869* (2013.01); *H01L 27/1225* (2013.01)
USPC .......... 257/43; 257/57; 257/E29.296; 438/104

(58) Field of Classification Search
CPC .......... H01L 29/7869; H01L 27/1225
See application file for complete search history.

(56) References Cited

U.S. PATENT DOCUMENTS

| | | | |
|---|---|---|---|
| 7,110,058 B2* | 9/2006 | Hayase et al. | 349/43 |
| 8,426,851 B2* | 4/2013 | Morosawa et al. | 257/43 |
| 2010/0193772 A1 | 8/2010 | Morosawa et al. | |
| 2011/0042670 A1* | 2/2011 | Sato et al. | 257/43 |

FOREIGN PATENT DOCUMENTS

| | | |
|---|---|---|
| CN | 101582453 A | 11/2009 |
| CN | 101794823 A | 8/2010 |
| WO | WO 2009/136645 A2 | 11/2009 |

* cited by examiner

*Primary Examiner* — Allen Parker
*Assistant Examiner* — Gardner W Swan
(74) *Attorney, Agent, or Firm* — Birch, Stewart, Kolasch & Birch, LLP

(57) ABSTRACT

A method for fabricating an oxide thin film transistor includes sequentially forming a gate insulating film, an oxide semiconductor layer, and a first insulating layer; selectively patterning the oxide semiconductor layer and the first insulating layer to form an active layer and an insulating layer pattern on the gate electrode; forming a second insulating layer on the substrate having the active layer and the insulating layer pattern formed thereon; and selectively patterning the insulating layer pattern and the second insulating layer to form first and second etch stoppers on the active layer. The oxide semiconductor layer may be a ternary system or quaternary system oxide semiconductor comprising a combination of $A_xB_yC_zO$ (A, B, C=Zn, Cd, Ga, In, Sn, Hf, Zr; x, y, z≥0).

6 Claims, 14 Drawing Sheets

OXIDE THIN FILM TRANSISTOR AND METHOD OF FABRICATING THE SAME

CROSS-REFERENCE TO RELATED APPLICATION

This application claims priority to and the benefit of Korean Patent Application No. 10-2010-0127171, filed on Dec. 13, 2010, which is hereby incorporated by reference.

BACKGROUND OF THE INVENTION

1. Field of the Invention

Embodiments of invention relate to a method for fabricating an oxide thin film transistor, and more particularly, to a method for fabricating an oxide thin film transistor using a ternary system or quaternary system oxide semiconductor comprising a combination of AxByCzO (A, B, C=Zn, Cd, Ga, In, Sn, Hf, Zr; x, y, z≥0) as an active layer.

2. Description of the Related Art

As interest in information displays is growing and demand for portable (mobile) information medium is increasing, research and commercialization of lighter and thinner flat panel displays ("FPD"), which may substitute for cathode ray tubes (CRTs), the theretofore conventional display devices, have been actively ongoing. Among FPDs, the liquid crystal display ("LCD") is a device for displaying images by using optical anisotropy of liquid crystals. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal of a pixel part is driven by using an amorphous silicon thin film transistors (a-Si TFTs) as a switching element.

The structure of a related art LCD will now be described in detail with reference to FIG. 1. FIG. 1 is an exploded perspective view showing a related art LCD device. As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for demarcating the sub-color filters 7 and blocking light transmission through the liquid crystal layer 30, and a transparent common electrode 8 for applying a voltage to the liquid crystal layer 30.

The array substrate 10 includes a plurality of gate lines 16 and a plurality of data lines 17 which are arranged vertically and horizontally to define a plurality of pixel regions (P), TFTs (T), switching elements, formed at respective crossings of the gate lines 16 and the data lines 17, and pixel electrodes 18 formed on the pixel regions (P).

The color filter substrate 5 and the array substrate 10 are attached in a facing manner by a sealant formed at the edges of an image display area to form a liquid crystal panel, and the attachment of the color filter substrate 5 and the array substrate 10 is made by attachment keys formed on the color filter substrate 5 or the array substrate 10.

The above-described LCD is a display device which has come into prominence so far with its advantages of being light and consuming a small amount of power, but it is a light receiving device, not a light emitting device, and has a technical limitation with respect to brightness, a contrast ratio, a viewing angle, and the like. Thus, development of a new display device that may overcome such shortcomings is actively ongoing.

An organic light emitting diode (OLED), one of the new types of flat panel display devices, is self-emissive, having a good viewing angle and contrast ratio compared with the LCD. Because it does not require a backlight, it can be formed to be lighter and thinner, and is advantageous in terms of power consumption. Also, the OLED is driven at a low DC voltage and has a fast response speed. In particular, the OLED is advantageous in terms of fabrication costs.

Recently, research for a large-scale OLED has been actively ongoing, and in order to attain it, development of a transistor achieving a stable operation and durability by securing constant current characteristics of a driving transistor of the OLED is required.

The amorphous silicon thin film transistor used for the above-described LCD may be fabricated in a low temperature process, but has a very small mobility and does not satisfy constant current bias conditions. Meanwhile, a polycrystalline silicon thin film transistor has high mobility and satisfies the constant current bias conditions, but it is difficult to obtain uniform characteristics, making it difficult to increase the size and requiring a high temperature process.

Thus, an oxide semiconductor thin film transistor including an active layer made of oxide semiconductor has been developed, but when the oxide semiconductor is applied to the thin film transistor having a typical bottom gate structure, the oxide semiconductor is damaged during an etching process of source and drain electrodes, in particular, during a dry etching process using plasma.

Thus, in order to address the problem, an etch stopper is additionally formed as a barrier layer on the active layer, but even in this instance, a back channel region of the active layer is exposed to the chemical material such as a photoresist or a stripper, and ultraviolet (UV) ray used for a photolithography process (or a photo process) for forming the active layer and the etch stopper, changing the characteristics of the oxide semiconductor to degrade the element characteristics.

FIG. 2 is a sectional view schematically showing a structure of the related art oxide thin film transistor. As illustrated, the related art oxide thin film transistor includes a gate electrode 21 formed on a substrate 10, a gate insulating layer 15a formed on the gate electrode 21, an active layer 24 formed of an oxide semiconductor and an etch stopper 25 made of a certain insulating material and formed on the gate insulating layer 15a, source and drain electrodes 22 and 23 electrically connected with certain areas of the active layer 24, a protective film 15b formed on the source and drain electrodes 22 and 23, and a pixel electrode 18 electrically connected with the drain electrode 23.

FIGS. 3A to 3F are sectional views sequentially showing a process of fabricating the related art oxide thin film transistor illustrated in FIG. 2. As shown in FIG. 3A, a first conductive film is deposited on the entire surface of a certain substrate 10 and selectively patterned through photolithography to form the gate electrode 21 formed of the first conductive film on the substrate 10.

Next, as shown in FIG. 3B, the gate insulating layer 15a and an oxide semiconductor layer made of a certain oxide semiconductor are sequentially deposited on the entire surface of the substrate 10, and then selectively patterned through photolithography to form the active layer 24 formed of the oxide semiconductor on the gate electrode 21.

Then, as shown in FIG. 3C, an insulating layer made of a certain insulating material is deposited on the entire surface of the substrate 10 and then selectively patterned through photolithography to form an etch stopper 25 made of the insulating material on the active layer 24.

Thereafter, as shown in FIG. 3D, a second conductive film is formed on the entire surface of the substrate 10 having the etch stopper 25 formed thereon and then selectively patterned through photolithography to form source and drain electrodes 22 and 23 formed of the second conductive film and electrically connected with source and drain regions of the active layer 24.

Then, as shown in FIG. 3E, the protective film 15b is formed on the entire surface of the substrate 10 having the source and drain electrodes 22 and 23 formed thereon and then selectively patterned through photolithography to form a contact hole 40 exposing a portion of the drain electrode 23.

Thereafter, as shown in FIG. 3F, a third conductive film is formed on the entire surface of the substrate 10 and then selectively patterned through photolithography to form the pixel electrode 18 electrically connected with the drain electrode 23 through the contact hole 40.

Namely, in the related art, after the oxide semiconductor layer is deposited, the active layer 24 is formed through photolithography, and then, the insulating layer is deposited to form the etch stopper 25. Also, the insulating layer is patterned through another photolithography process to form the etch stopper 25.

In this instance, the patterning of the active layer 24 and the depositing of the insulating layer are performed after a vacuum state of a vacuum chamber is released, so the oxide semiconductor is exposed in the air, and also, as the photolithography process is performed to pattern the active layer 24 and the etch stopper 25, the back channel region is exposed to the chemical material such as the photoresist or a stripper and UV, so as to be damaged. As a result, the electrical characteristics of the thin film transistor are degraded.

In general, the oxide semiconductor has two kinds of characteristics of a conductor and a semiconductor and may transition therebetween by adjusting carrier concentration within the thin film. The carrier concentration can be adjusted by electrons created as oxygen vacancies are generated, and in this instance, the oxygen vacancies are generated due to the damage of the oxide semiconductor in various processes. Results of research show that the oxide semiconductor is also damaged even by a solvent of a base besides generally known acid.

SUMMARY OF THE INVENTION

An aspect of the invention provides a method for fabricating an oxide thin film transistor using a ternary system or quaternary system oxide semiconductor comprising a combination of $A_xB_yC_zO$ (A, B, C=Zn, Cd, Ga, In, Sn, Hf, Zr; x, y, z≥0) as an active layer.

Another aspect of the invention provides a method for fabricating an oxide thin film transistor capable of minimizing damage to a back channel of an active layer during a process.

Another aspect of the invention provides a method for fabricating an oxide thin film transistor capable of forming a contact region with source and drain electrodes by reducing resistance of an oxide semiconductor layer exposed through etching of an insulating layer.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims thereof as well as the appended drawings.

According to an aspect of the invention, there is provided a method for fabricating an oxide thin film transistor, including: forming a gate electrode on a substrate; sequentially forming a gate insulating film, an oxide semiconductor layer, and a first insulating layer; selectively patterning the oxide semiconductor layer and the first insulating layer to form an active layer and an insulating layer pattern on the gate electrode, respectively; forming a second insulating layer on the substrate having the active layer and the insulating layer pattern formed thereon; selectively patterning the insulating layer pattern and the second insulating layer to form first and second etch stoppers on the active layer, respectively; and forming source and drain electrodes electrically connected with source and drain regions of the active layer on the substrate having the first and second etch stoppers formed thereon.

The oxide semiconductor layer may be a ternary system or quaternary system oxide semiconductor comprising a combination of $A_xB_yC_zO$ (A, B, C=Zn, Cd, Ga, In, Sn, Hf, Zr; x, y, z≥0).

The second etch stopper may be formed so that a portion of the second etch stopper covers side portions of the active layer and the first etch stopper.

The method may further include: forming a protective layer on the substrate having the source and drain regions formed thereon; selectively removing the protective layer to form a contact hole exposing the drain electrode; and forming a pixel electrode electrically connected with the drain electrode through the contact hole.

The oxide semiconductor layer may be made of amorphous zinc oxide-based semiconductor.

The substrate may be formed as a glass substrate or a plastic substrate.

The first and second insulating layers may be patterned by using dry etching such as an oxygen plasma treatment.

When the first and second insulating layers are patterned, the active layer is exposed rather than being covered by the first and second etch stoppers to thus form the source and drain regions, may have resistance which has been reduced by the oxygen plasma in contact regions with the source and drain electrodes.

The method may further include: performing a surface treatment or a thermal treatment after the first and second etch stoppers are formed, to reduce the resistance of the exposed oxide semiconductor layer.

The insulating layer pattern may be patterned to have substantially the same shape as that of the underlying active layer.

The insulating layer pattern and the second insulating layer may be selectively patterned to form the first and second etch stoppers formed of the first and second insulating layers on a portion of the active layer excluding the source and drain regions of the active layer.

The active layer and the second etch stopper are arranged to be perpendicular.

The second etch stopper may be patterned to have substantially the same width as that of the underlying first etch stopper.

In the method for fabricating an oxide thin film transistor according to an embodiment of the invention, since the amorphous oxide semiconductor is used as the active layer, excellent uniformity can be obtained and the oxide thin film transistor can be applicable to a large scale display.

In this instance, the amorphous oxide semiconductor reacts to plasma in a follow-up process, changing the carrier concentration of the channel region, but in the method for fabricating an oxide thin film transistor according to an embodiment of the invention, the change in the carrier concentration at the channel region is prevented by using the etch stopper, thus prevent a degradation of the oxide semiconductor.

In particular, in the method for fabricating an oxide thin film transistor according to an embodiment of the invention, after the oxide semiconductor layer and the insulating layer are sequentially deposited to form the active layer, another insulating layer is again deposited and patterned to form the etch stopper. Thus, damage to the back channel of the active layer during the process can be minimized, thus improving the element characteristics.

According to an aspect of the invention, an oxide thin film transistor includes a substrate, a gate electrode on a substrate; a gate insulating film, an active layer, a first etch stopper and a second etch stopper sequentially disposed on the gate electrode; and source and drain electrodes electrically connected with source and drain regions of the active layer on the substrate having the first and second etch stoppers formed thereon, wherein the second etch stopper is formed so that a portion of the second etch stopper covers side portions of the active layer and the first etch stopper.

The active layer may be formed of a ternary system or quaternary system oxide semiconductor comprising a combination of AxByCzO (A, B, C=Zn, Cd, Ga, In, Sn, Hf, Zr; x, y, z≥0).

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

An oxide thin film transistor (TFT) according to embodiments of the invention will now be described in detail with reference to the accompanying drawings.

Figure 1:
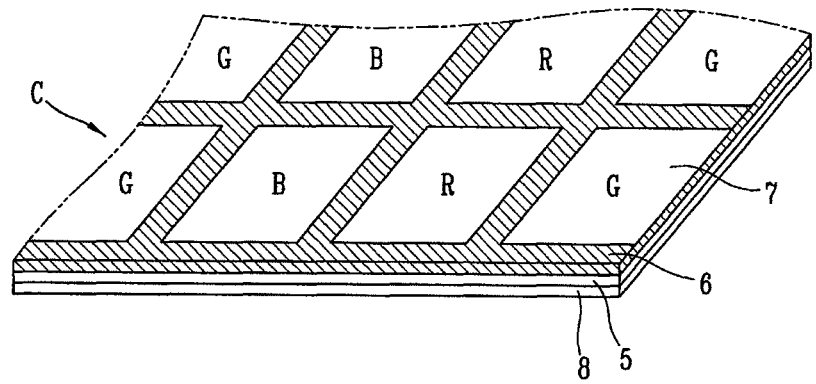
FIG. 1 is an exploded perspective view schematically showing a related art liquid crystal display (LCD) device.
Figure 1:
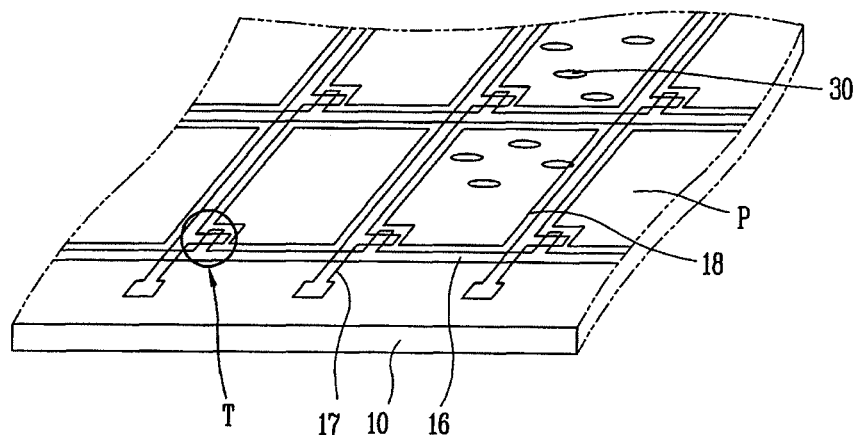
Figure 2:
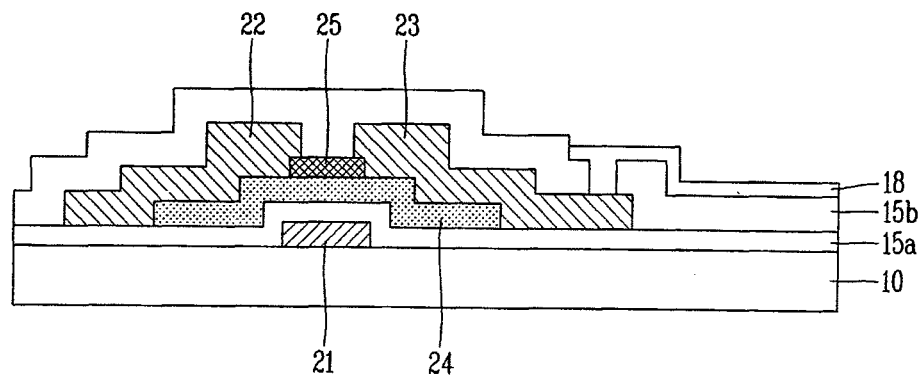
FIG. 2 is a sectional view schematically showing a structure of a related art oxide thin film transistor.
Figure 3A:
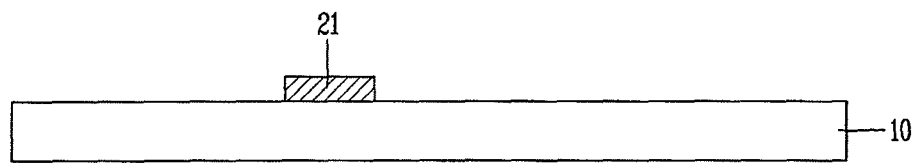
FIGS. 3A to 3F are sectional views sequentially showing a fabrication process of the related art oxide TFT of FIG. 2.
Figure 3B:
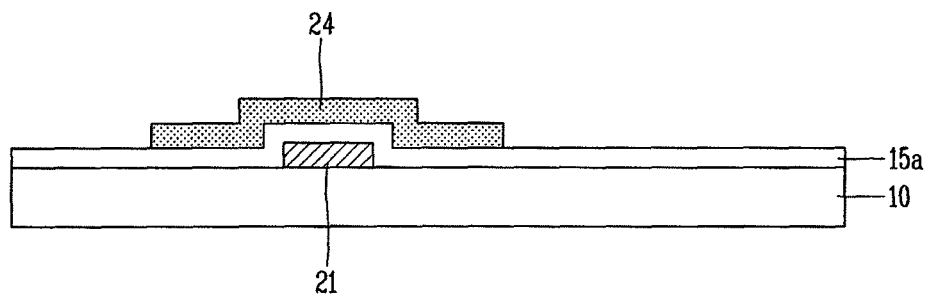
Figure 3C:
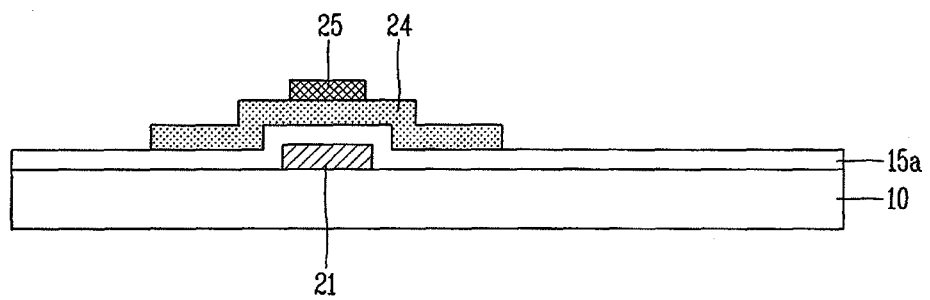
Figure 3D:
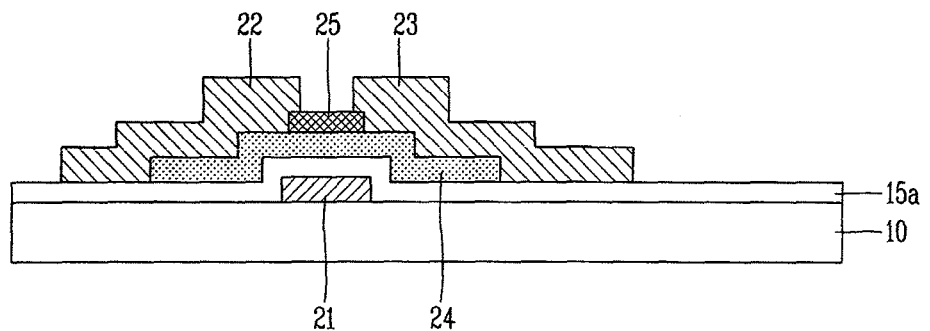
Figure 3E:
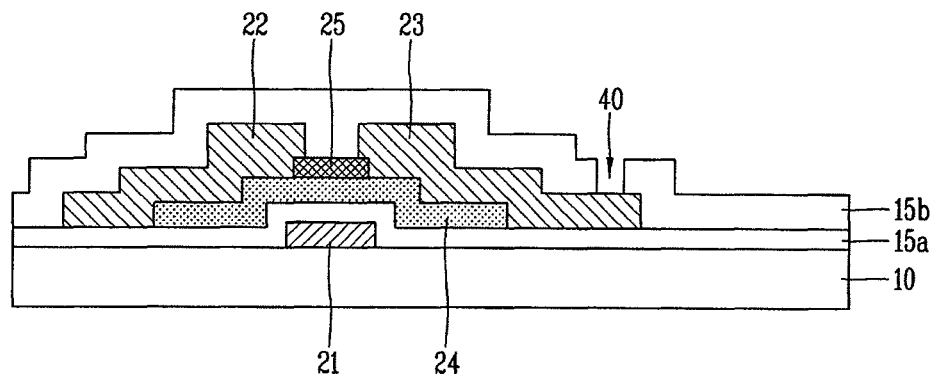
Figure 3F:
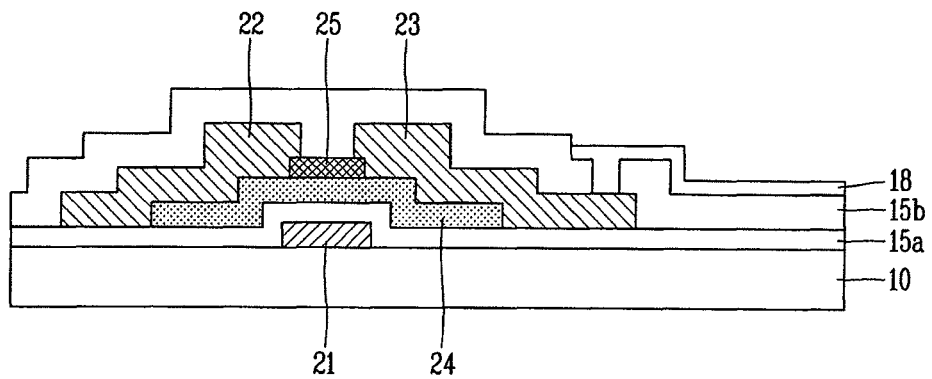
Figure 4:
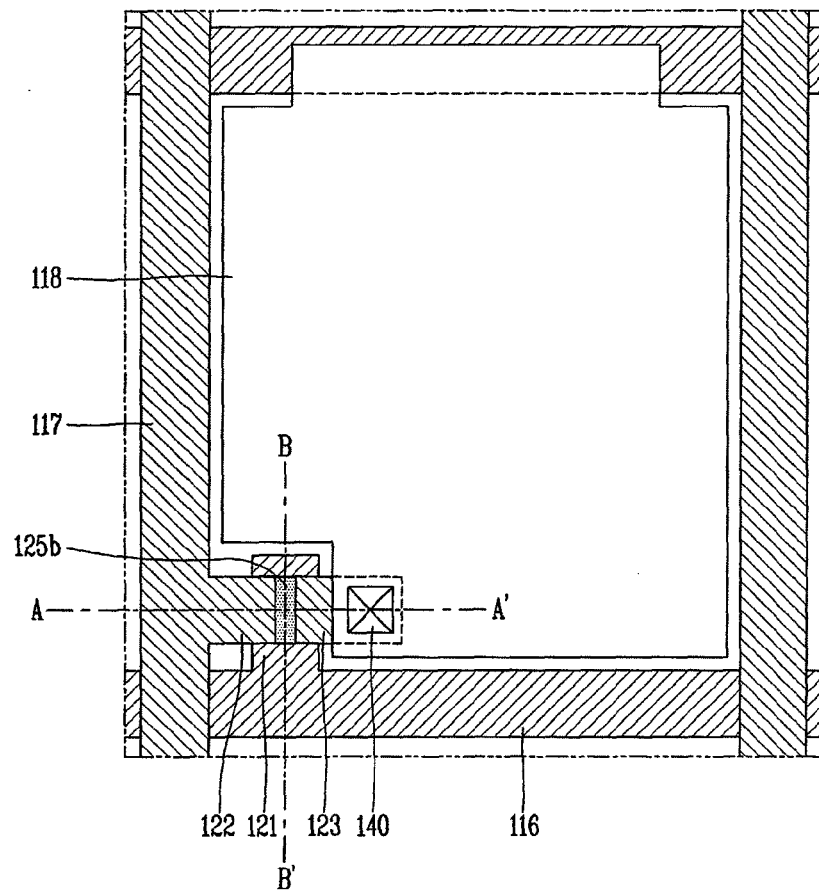
FIG. 4 is a plan view showing a portion of an array substrate of a liquid crystal display (LCD) device according to an embodiment of the invention.

FIG. 4 is a plan view showing a portion of an array substrate of a liquid crystal display (LCD) device according to an embodiment of the invention. In actuality, N number of gate lines and M number of data lines are formed to cross each other to define the M×N number of pixels in the LCD device, but in order to simplify the explanation, only a single pixel is shown in FIG. 4.

Figure 5:
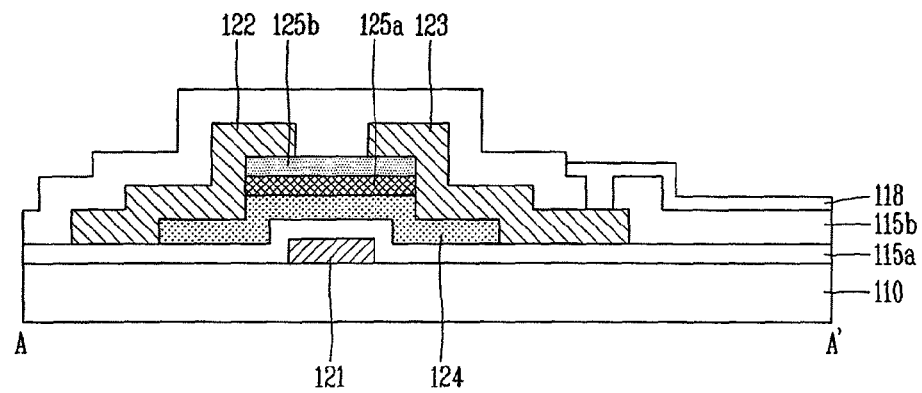
FIG. 5 is a sectional view schematically showing a structure of an oxide thin film transistor (TFT) according to an embodiment of the invention.

FIG. 5 is a sectional view schematically showing a structure of an oxide thin film transistor (TFT) according to an embodiment of the invention, which is taken along line A-A' of the array substrate illustrated in FIG. 4. In this instance, FIG. 5 schematically shows the structure of an oxide TFT using a ternary system or quaternary system oxide semiconductor comprising a combination of AxByCzO (A, B, C=Zn, Cd, Ga, In, Sn, Hf, Zr; x, y, z≥0), as an active layer.

As illustrated in FIG. 4, a gate line 116 and a data line 117 are formed to be arranged vertically and horizontally to define a pixel region on an array substrate 110. A thin film transistor (TFT), i.e., a switching element, is formed at a crossing of the gate line 116 and the data line 117. A pixel electrode 118 is formed within the pixel region, is connected with the TFT to drive liquid crystal together with a common electrode of a color filter substrate.

The oxide TFT according to an embodiment of the invention includes a gate electrode 121 formed on the array substrate 110, a gate insulating film 115a formed on the gate electrode 121, an active layer 124 made of an oxide semiconductor and formed at an upper side of the gate electrode 121, first and second etch stoppers 125a and 125b made of a certain insulating material, and source and drain electrodes 122 and 123 electrically connected with source and drain regions of the active layer 124.

Also, the oxide TFT according to an embodiment of the invention includes a protective layer 115b formed on the array substrate 110 having the source and drain electrodes 122 and 123 formed thereon, and a pixel electrode 118 electrically connected with the drain electrode 123 through a contact hole 140 formed in the protective layer 115b.

In this instance, the gate electrode 121 is connected with the gate line 116, and a portion of the source electrode 122 extends in one direction so as to be connected with the data line 117, and as mentioned above, the gate line 116 and the data line 117 are arranged vertically (or a first direction) and horizontally (or a second direction) on the array substrate 110 to define a pixel region.

In this instance, in the oxide TFT includes according to an embodiment of the invention, the active layer 124 is formed by using a ternary system or quaternary system oxide semiconductor comprising a combination of AxByCzO (A, B, C=Zn, Cd, Ga, In, Sn, Hf, Zr; x, y, z≥0), high mobility is obtained, constant current testing conditions are met, and uniform characteristics are obtained, so the oxide TFT according to an embodiment of the invention can be applicable to a large scale display including an LCD and an OLED.

Also, recently, much interest and activities are concentrated on a transparent electronic circuit, and the oxide TFT employing the oxide semiconductor as the active layer 124 has high mobility and can be fabricated at a low temperature, and thus, the oxide TFT can be used in a transparent electronic circuit.

Also, the oxide semiconductor has a wide band gap, so it can be used in fabricating a UV LED, a white LED and any other components having high color purity, and also, since the oxide semiconductor can be processed at a low temperature, it may be used in manufacturing a light and flexible product.

In the oxide TFT according to an embodiment of the invention having the foregoing characteristics, the first etch stopper 125a and a second etch stopper 125b made of a certain insulating material are formed at an upper portion of a channel region of the active layer 124, and in this instance, the first and second etch stoppers 125a and 125b serve to prevent carrier concentration of the channel region from being changed due to a plasma treatment in a follow-up process.

Also, in the oxide TFT according to an embodiment of the invention, after the oxide semiconductor layer is deposited, the insulating layer is immediately deposited to form the first etch stopper 125a, thus minimizing damage to the back channel of the active layer 124 due to a chemical material or UV during the process. Namely, the oxide semiconductor layer and the insulating layer are sequentially deposited to form the active layer 24, and then, another insulating layer is deposited and patterned to form the first and second etch stoppers 125a and 125b. This will be described in detail through a method for fabricating an oxide TFT as follows.

The active layer 124 and the second etch stopper 125b are arranged in a crossing direction, and left and right regions of the active layer 124, which are not covered by the first and second etch stoppers 125a and 125b but exposed, constitute source and drain regions forming contact regions with the source and drain electrodes 122 and 123.

Also, the first etch stopper 125a, the second etch stopper 125b, and the active layer 124 have an island-like shape. The second etch stopper 125b is patterned to substantially have the same width as that of the underlying first etch stopper 125a.

FIGS. 6A to 6F are plan views sequentially showing a process of fabricating an array substrate illustrated in FIG. 4 according to an embodiment of the invention. FIGS. 7A to 7G are sectional views sequentially showing a process of fabricating an oxide TFT illustrated in FIG. 5 according to an embodiment of the invention. FIG. 8 is another sectional view schematically showing a structure of an oxide thin film transistor (TFT) according to an embodiment of the invention, which is taken along line B-B' of the array substrate illustrated in FIG. 4.

Figure 6A:
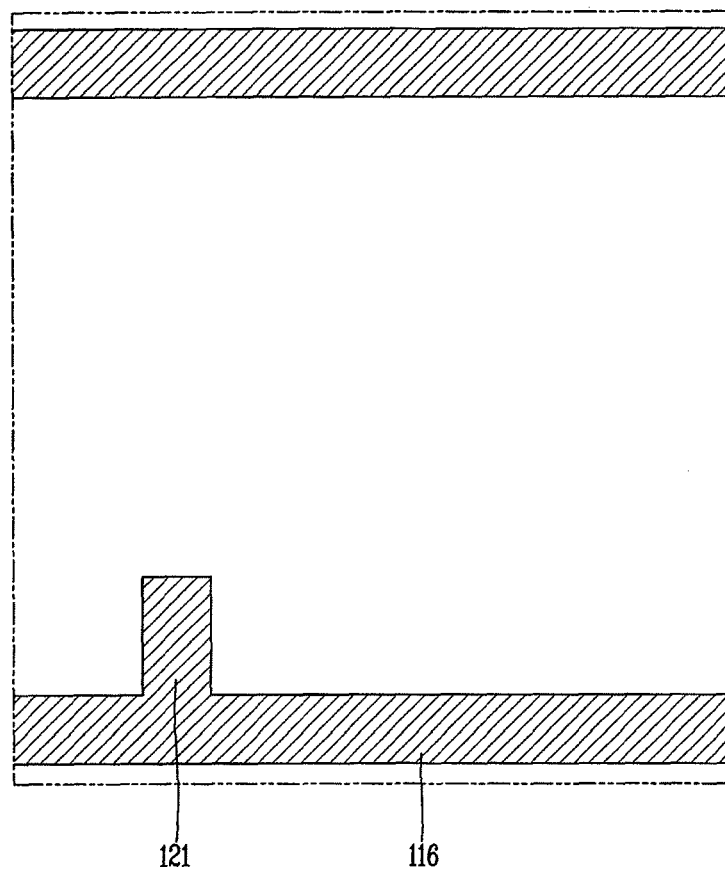
FIGS. 6A to 6F are plan views sequentially showing a process of fabricating an array substrate illustrated in FIG. 4 according to an embodiment of the invention.
Figure 7A:
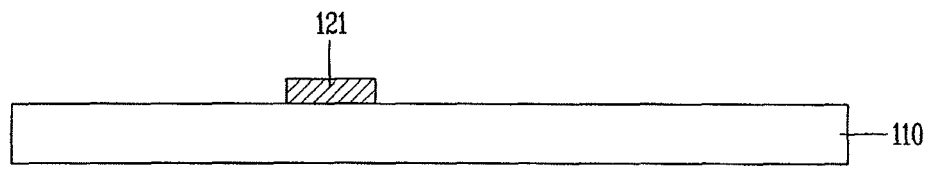
FIGS. 7A to 7G are sectional views sequentially showing a process of fabricating an oxide TFT illustrated in FIG. 5 according to an embodiment of the invention.
Figure 8:
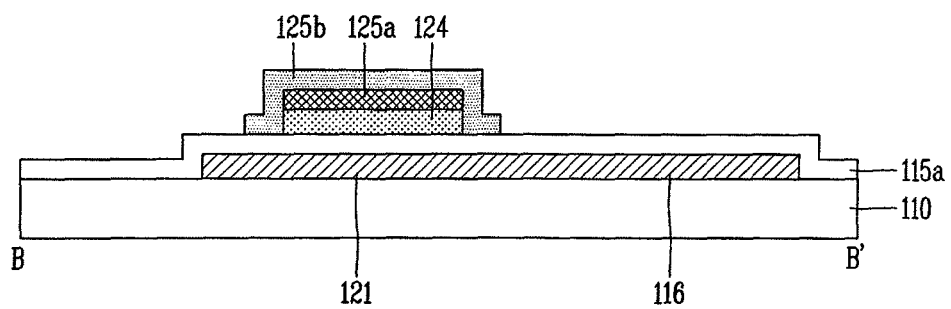
FIG. 8 is another sectional view schematically showing a structure of an oxide thin film transistor (TFT) according to an embodiment of the invention.

As shown in FIGS. 6A and 7A, the gate electrode 121 and the gate line 116 are formed on the array substrate 110 made of a transparent insulating material. In this instance, an oxide semiconductor applied to (or utilized for) the oxide TFT may be deposited at a low temperature, so a substrate, such as a plastic substrate, soda lime glass, or the like, which can be applicable at a low temperature process may be used. Also, since the oxide TFT has amorphous characteristics, it can be used for a substrate of a large scale display.

The gate electrode 121 and the gate line 116 are formed by depositing a first conductive film on the entire surface of the array substrate 110 and then selectively patterning the same through photolithography.

In this instance, the first conductive film may be made of a low resistance opaque conductive material such as aluminum (Al), an aluminum alloy, tungsten (W), copper (Cu), nickel (Ni), chromium (Cr), molybdenum (Mo), a molybdenum alloy, titanium (Ti), platinum (Pt), tantalum (Ta), or the like. Also, the first conductive film may be made of a transparent conductive material such as indium tin oxide (ITO), indium zinc oxide (IZO), or the like, and may have a multilayered structure in which two or more conductive materials are stacked.

Figure 7B:
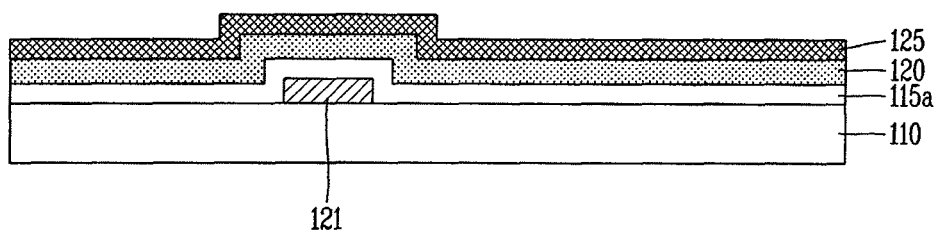

Next, as shown in FIG. 7B, the gate insulating layer 115a, the oxide semiconductor layer 120 formed of a certain oxide semiconductor, and the first insulating layer 125 made of a certain insulating material are sequentially formed on the entire surface of the array substrate 110 having the gate electrode 121 and the gate line 116 formed thereon.

In this instance, an inorganic insulating film such as a silicon nitride film (SiNx), silicon oxide film ($SiO_2$), or the like, or a high dielectric oxide film such as hafnium (Hf) oxide or aluminum oxide may be used as the gate insulating film 115a, and a silicon oxide film may be used as the first insulating layer 125.

The oxide semiconductor layer 120 may be formed of a ternary system or quaternary system oxide semiconductor comprising a combination of AxByCzO (A, B, C=Zn, Cd, Ga, In, Sn, Hf, Zr; x, y, z≥0).

The gate insulating film 115a and the first insulating layer 125 may be formed through chemical vapor deposition (CVD) such as plasma enhanced chemical vapor deposition (PECVD), or physical vapor deposition (PVD) such as sputtering, or the like.

Figure 6B:
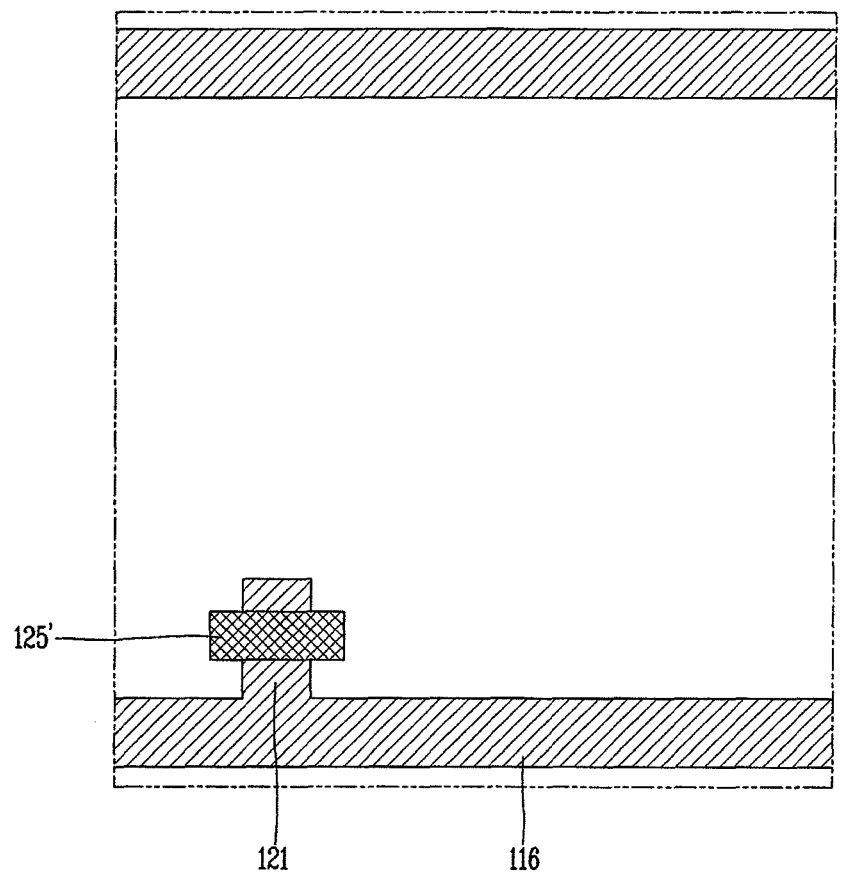
Figure 7C:
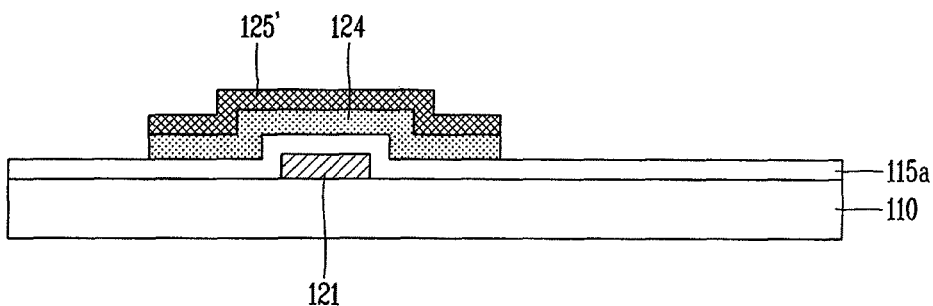

Then, as shown in FIGS. 6B and 7C, when the first insulating layer 125 and the oxide semiconductor layer 120 are selectively patterned through photolithography, the active layer 124 formed of oxide semiconductor is formed at an upper side of the gate electrode 121 of the array substrate 110.

In this instance, an insulating layer pattern 125', made of the insulating material and patterned to have the substantially same shape as the active layer 124 is formed on the active layer 124.

In this instance, the first insulating layer 125 may be etched by using dry etching such as oxygen plasma etching, and since the insulating layer pattern 125' is patterned to have substantially the same shape as the underlying active layer 124, the entire area of the underlying oxide semiconductor layer, namely, the active layer 124, is prevented from being exposed, whereby instability due to the otherwise exposure can be removed and damage due to the patterning of the insulating layer pattern 125' can be prevented.

Additionally, when the first insulating layer 125 is being etched by the using dry etching, side walls or side portions of the insulating layer pattern 125' and the active layer 124 are exposed. The exposed side wall or side portions of the insulating layer pattern 125' and the active layer 124 are portions having surfaces that are essentially perpendicular to the array substrate 110. Further, the surfaces of the exposed side wall or side portions of the insulating layer pattern 125' and the active layer 124 also extend from the source region to the drain region of the active layer. Accordingly, the surfaces of the exposed side wall or side portions of the insulating layer pattern 125' and the active layer 124 are also essentially parallel to the array substrate 110.

Figure 6C:
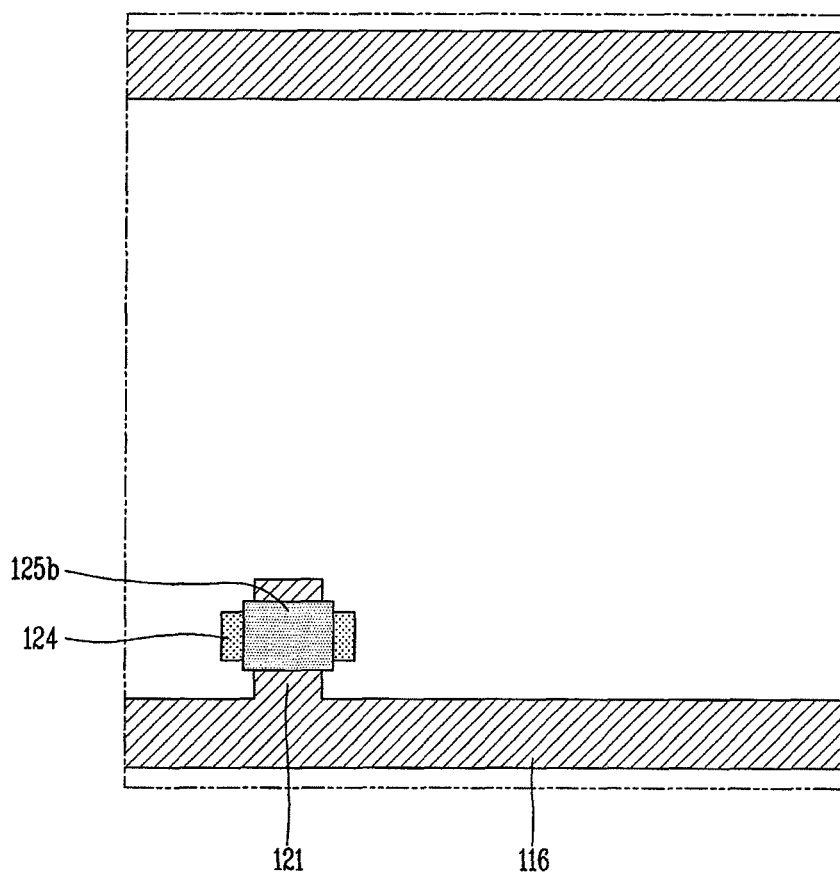
Figure 7D:
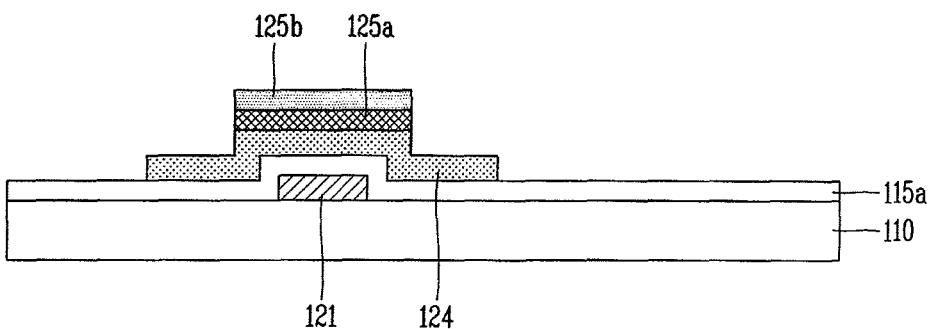
Figure 7E:
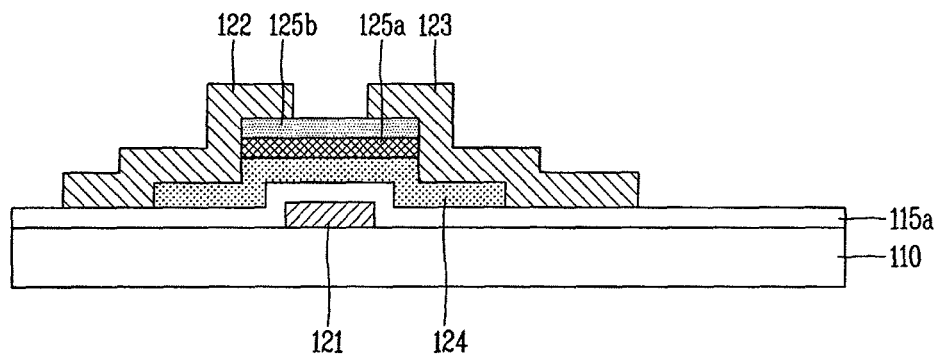

Thereafter, as shown in FIGS. 6C and 7D, a second insulating layer made of a certain insulating material is deposited on the entire surface of the array substrate 110 having the active layer 124 and the insulating layer pattern 125' formed thereon, including the exposed side wall or side portions of the insulating layer pattern 125' and the active layer 124, and then, the insulating layer pattern 125' and the second insulating layer are selectively patterned through photolithography. Accordingly, the first etch stopper 125a and the second etch stopper 125b, each made of the respective insulating material, are sequentially formed on the active layer 124, excluding the left and right regions of the active layer 124, namely, excluding the source and drain regions. Further, the second etch stopper 125b is formed so that a portion of the second etch stopper 125b covers the side walls or the side portions of the active layer 124 and the first etch stopper 125a.

In this instance, as the second insulating layer, an inorganic insulating film such as a silicon oxide film, a silicon nitride film or a high dielectric oxide film such as hafnium oxide or aluminum oxide may be used.

In this instance, the active layer 124 and the second etch stopper 125b are arranged to be perpendicular. That is, the second etch stopper 125b extends perpendicularly relative to the active layer 124, when the second etch stopper 125b and the active layer 124 are both parallel to the array substrate 110. The first etch stopper 125a, the second etch stopper 125b, and the active layer 124 are formed as an island, and the second etch stopper 125b is patterned to have substantially the same width as that of the first etch stopper 125a.

Also, the source and drain regions of the active layer 124, exposed rather than being covered by the first etch stopper 125a and the second etch stopper 125b, form contact areas with the source and drain electrodes as resistance is reduced by an oxygen plasma treatment when the insulating layer pattern and the second insulating layer are etched through the oxygen plasma treatment to form the first etch stopper 125a and the second etch stopper 125b. However, embodiments of the invention are not limited thereto, and the source and drain regions, contact regions, may be formed by reducing resistance of the active layer 124 exposed through a thermal treatment or a surface treatment such as the oxygen plasma treatment after the first etch stopper 125a and the second etch stopper 125b are formed.

Also, in the embodiment of the invention, the instance in which the active layer 124 is arranged to be perpendicular to the gate electrode 121 is described as an example, but the embodiments of the invention are not limited thereto, and the active layer 124 may be patterned to be arranged in the same direction as that of the gate electrode 121, and in this instance, the second etch stopper 125b may be patterned to be perpendicular to the underlying active layer 124, i.e., the gate electrode 121.

As described above, in the embodiment of the invention, the gate insulating film 115a, the oxide semiconductor layer, and the first insulating layer are sequentially deposited to form the active layer 124, and the second insulating layer is deposited and patterned to form the first etch stopper 125a and the second etch stopper 125b, whereby an exposure of the back channel region of the active layer 124 can be prevented, instability due to an exposure can be eliminated, and a loss of the gate insulating film 115a can be prevented.

Figure 6D:
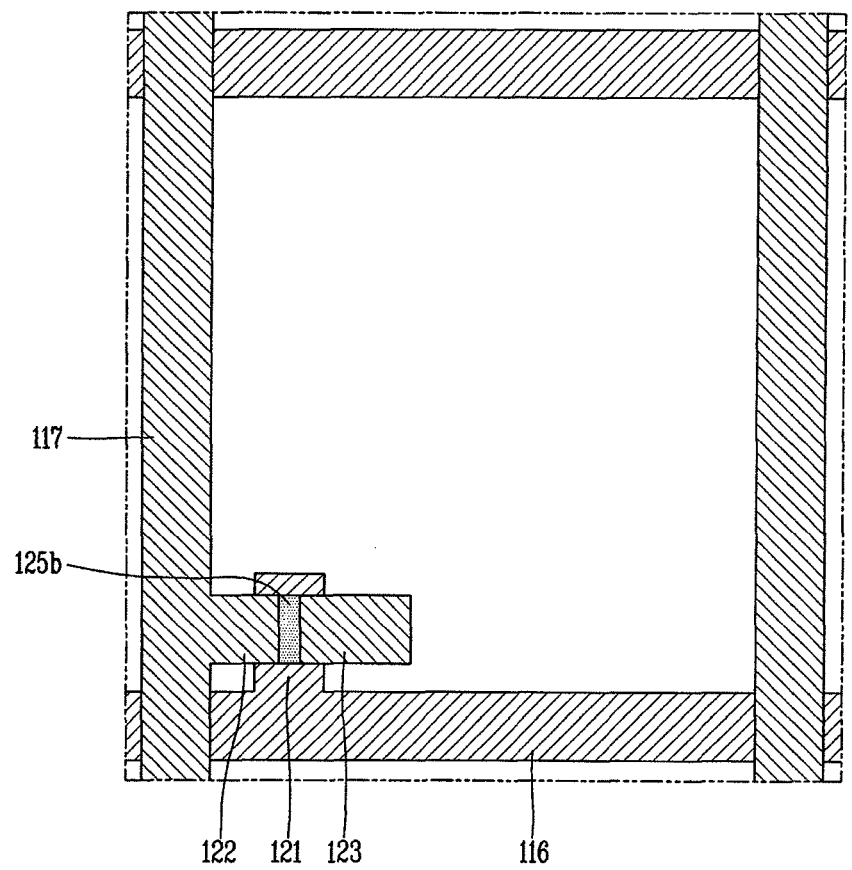

Thereafter, as shown in FIGS. 6D and 7C, a second conductive film is formed on the entire surface of the array substrate 110 having the active layer 124, the first etch stopper 125a, and the second etch stopper 125b formed thereon.

In this instance, the second conductive film may be made of a low-resistance opaque conductive material such as aluminum (Al), an aluminum alloy, tungsten (W), copper (Cu), nickel (Ni), chromium (Cr), molybdenum (Mo), a molybdenum alloy, titanium (Ti), platinum (Pt), tantalum (Ta), or the like. Also, the second conductive film may be made of transparent material such as ITO, IZO, or the like, or may be formed to have a multi-layered structure in which two or more conductive materials are stacked.

Then, the second conductive film is selectively patterned through photolithography to form the source electrode 122 and the drain electrode 123 electrically connected with the source region and the drain region of the active layer 124, respectively.

Figure 6E:
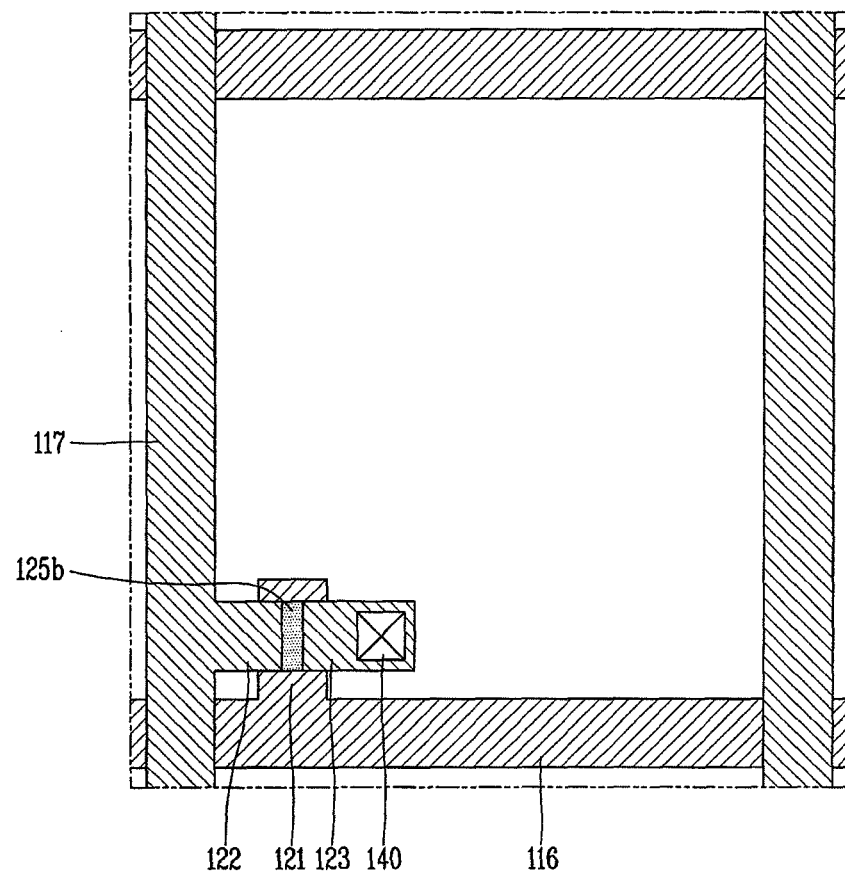
Figure 7F:
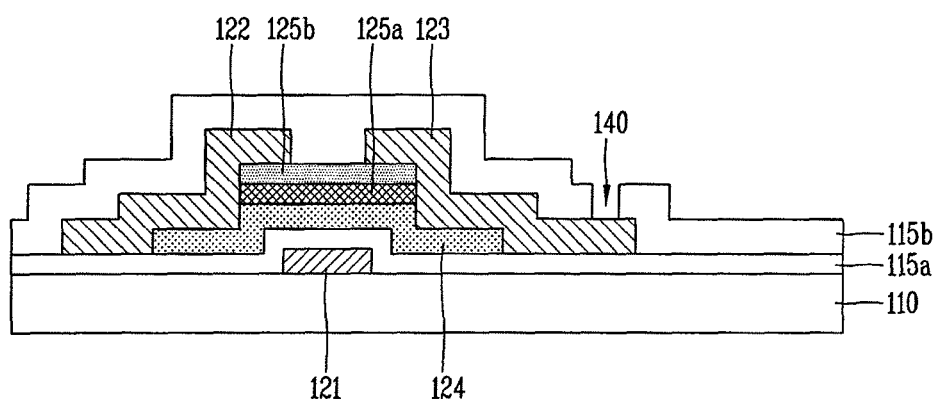

Thereafter, as shown in FIGS. 6E and 7F, the protective film 115b is formed on the entire surface of the array substrate 110 having the source and drain electrodes 122 and 123 formed thereon, and then selectively removed through photolithography to form the contact hole 140 exposing a portion of the drain electrode 123 on the array substrate 110.

Figure 6F:
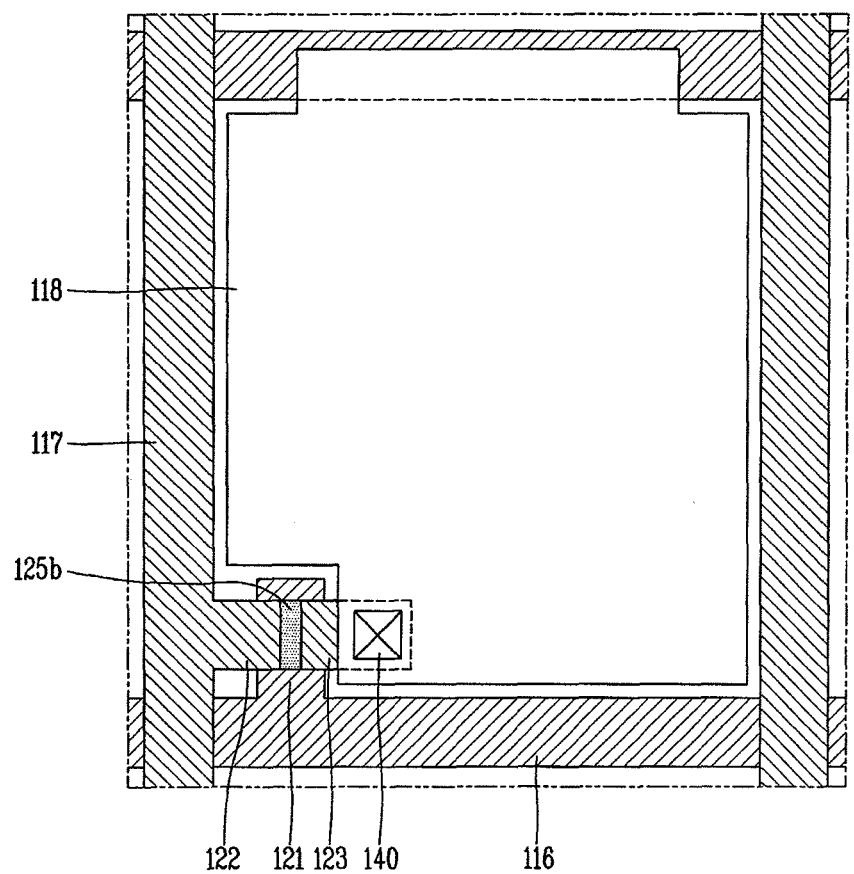
Figure 7G:
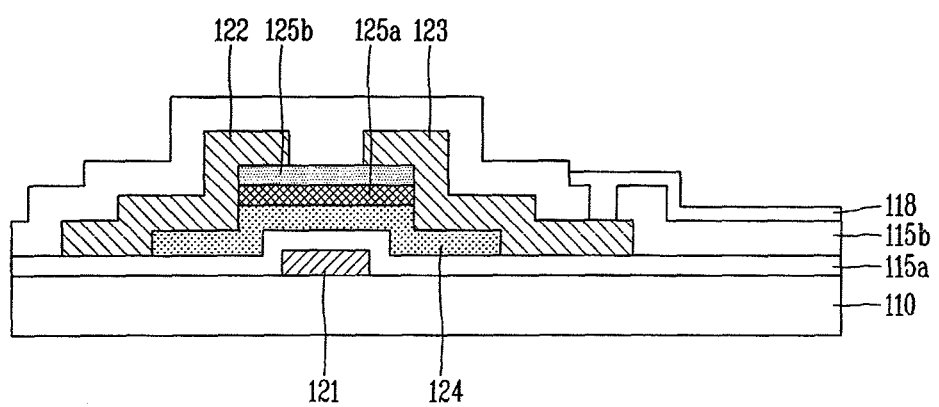

Then, as shown in FIGS. 6F and 7G, a third conductive film is formed on the entire surface of the array substrate 110 having the protective film 115b formed thereon and selectively removed through photolithography to from the pixel electrode 118 formed of the third conductive film on the array substrate 110 and electrically connected with the drain electrode 123 through the contact hole 140.

In this instance, the third conductive film may be made of a transparent conductive material having excellent transmittance, such as ITO or IZO in order to form the pixel electrode 118.

FIG. 8 shows the second etch stopper 125b being formed so that a portion of the second etch stopper 125b covers the side walls or the side portions of the active layer 124 and the first etch stopper 125a, when the side walls or the side portions of the active layer 124 and the first etch stopper 125a are both perpendicular and parallel to the array substrate 110.

Figure 9:
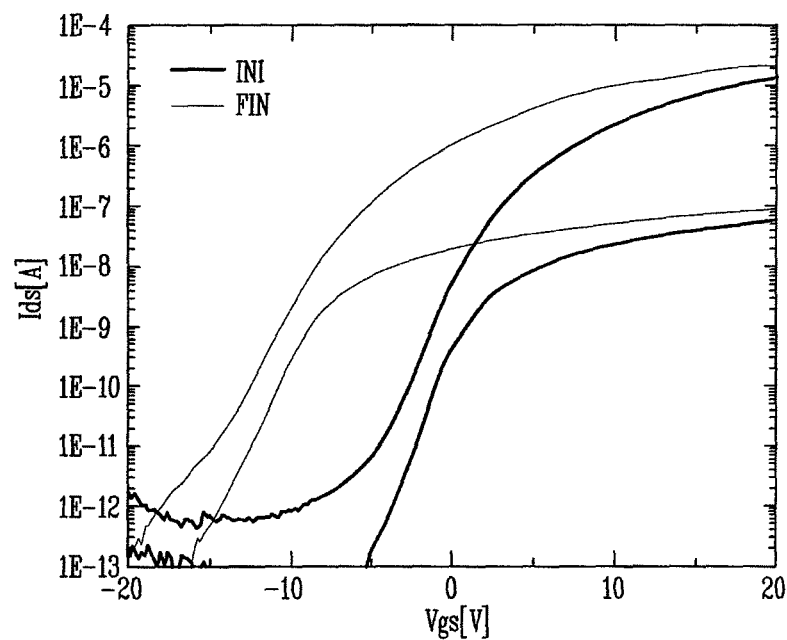
FIGS. 9 and 10 are graphs showing transfer characteristics of the oxide TFT.
Figure 10:
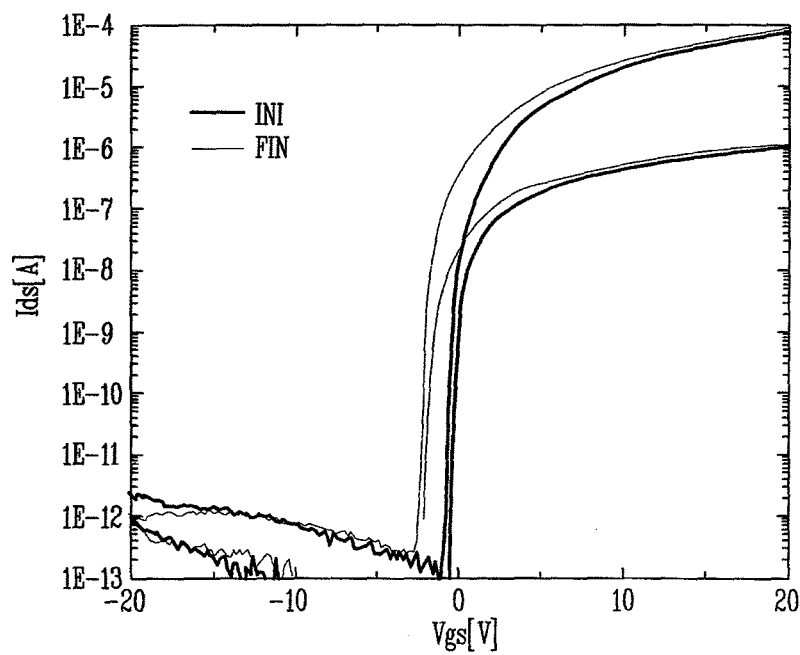

FIGS. 9 and 10 are graphs showing transfer characteristics of the oxide TFT. FIG. 9 shows transfer characteristics of a typical oxide TFT and FIG. 10 shows transfer characteristics of the oxide TFT according to an embodiment of the invention. In this instance, FIGS. 9 and 10 show the results obtained by measuring transfer characteristics of the respective oxide TFT at an initial state (INI) and a state (FIN) in which stress is applied. For example, the stress test applies a negative bias of −30V to a gate voltage. Namely, the negative bias was applied for one hour under backlight irradiation of 5000 unit at 60° C.

As illustrated, it is noted that the typical oxide TFT has a gentler slope of a transfer curve and lower on-current than those of the oxide TFT according to an embodiment of the invention, and its element characteristics are degraded by the stress test. The reason for this is because the back channel region of the active layer has been damaged to a degree by the photolithography for forming the active layer and the etch stopper.

In comparison, the oxide TFT according to an embodiment of the invention has a steep slope of the transfer curve and improved on-current, so it is noted that the transfer characteristics were improved and the element characteristics were not degraded by the stress test.

As described above, the invention may also be used in a different display device fabricated by using TFTs as well as the LCD device, for example, an organic electroluminescent display device in which an organic electroluminescent element is connected to a driving transistor.

In addition, because the amorphous oxide semiconductor material that has high mobility and a low temperature processing is applied as the active layer, the embodiments of the invention can be advantageously used for a transparent electronic circuit or a flexible display.

Although discussed in terms of the oxide thin film transistor being a ternary system or quaternary system oxide semiconductor, and being a combination of $A_x B_y C_z O$ (A, B, C=Zn, Cd, Ga, In, Sn, Hf, Zr; x, y, z≥0) as an active layer, the embodiments of the invention are not limited thereto. That is, the active layer may be formed of any oxide semiconductor.

As the invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating an oxide thin film transistor, the method comprising:
   forming a gate electrode on a substrate;
   sequentially forming a gate insulating film, an oxide semiconductor layer, and a first insulating layer on an entire surface of the substrate having the gate electrode formed thereon;
   selectively patterning the oxide semiconductor layer and the first insulating layer by using dry etching to form an active layer at an upper side of the gate electrode and an insulating layer pattern on the active layer, respectively, wherein the insulating layer pattern is patterned to have the same shape as the underlying active layer;
   forming a second insulating layer on the substrate having the active layer and the insulating layer pattern formed thereon and including exposed side portions of the insulating layer pattern and the active layer;
   forming first and second etch stoppers on the active layer to expose left and right regions of the active layer by selectively patterning the insulating layer pattern and the second insulating layer, respectively, through an oxygen plasma treatment,
   wherein the exposed left and right regions of the active layer undergo the oxygen plasma treatment to thus form source and drain regions of the active layer by reducing resistance of the exposed left and right regions of the active layer; and
   wherein the first etch stopper is patterned to have the same width as that of the active layer, and the second etch stopper is patterned to have the same length as that of the first etch stopper,
   wherein a width of the second etch stopper is wider than those of the first etch stopper and the active layer to cover the exposed portions of the insulating layer pattern and the active layer,
   wherein the lengths of the first and second etch stoppers are wider than a width of the gate electrode, and
   forming source and drain electrodes electrically connected with source and drain regions of the active layer on the substrate.

2. The method of claim 1, wherein the oxide semiconductor layer is a ternary system or quaternary system oxide semiconductor comprising a combination of AxByCzO (A, B, C=Zn, Cd, Ga, In, Sn, Hf, Zr; x, y, z$\geq$0).

3. The method of claim 1, further comprising:
   forming a protective layer on the substrate having the source and drain regions formed thereon;
   selectively removing the protective layer to form a contact hole exposing a portion of the drain electrode; and
   forming a pixel electrode electrically connected with the drain electrode through the contact hole.

4. The method of claim 1, wherein the oxide semiconductor layer is made of an amorphous zinc oxide-based semiconductor.

5. The method of claim 1, wherein the substrate is formed as a glass substrate or a plastic substrate.

6. The method of claim 1, further comprising:
   performing a surface treatment or a thermal treatment after the first and second etch stoppers are formed, to reduce the resistance of the source and drain regions of the active layer.

* * * * *